United States Patent [19]

Perna et al.

[11] Patent Number: 4,726,044

[45] Date of Patent: Feb. 16, 1988

[54] WRITING INSTRUMENT WITH SOLAR-POWERED ELECTRONIC COUNTING AND LIQUID CYRSTAL DISPLAY

[75] Inventors: Fred P. Perna, 1417 W. Park, Anaconda, Mont. 59711; Stuart R. Peterson, Minnetonka, Minn.

[73] Assignee: Fred P. Perna, Anaconda, Mont.

[21] Appl. No.: 920,713

[22] Filed: Oct. 20, 1986

[51] Int. Cl.[4] ...................... H03K 21/18; H03K 21/38

[52] U.S. Cl. ...................................... 377/15; 377/107; 377/53; 377/112; 136/291; 368/205; 250/206

[58] Field of Search .................. 377/6, 53, 8, 107, 20, 377/15, 24, 112; 235/64; 368/3, 9, 14, 205; 136/291, 292; 250/205, 552, 206

[56] References Cited

U.S. PATENT DOCUMENTS 3,064,888 11/1962 van de Mark ........................ 235/64
3,254,836 6/1966 Corpian ................................ 235/64
3,617,708 11/1971 Bongiovanni ......................... 235/64
3,630,015 12/1971 Lehovec ............................. 136/291
4,295,038 10/1981 Kreinbrink et al. .................... 377/6
4,409,538 10/1983 Tabata ................................ 368/205

FOREIGN PATENT DOCUMENTS 2542831 4/1977 Fed. Rep. of Germany ........ 377/15

*Primary Examiner*—John S. Heyman
*Attorney, Agent, or Firm*—Peterson, Wicks, Nemer & Kamrath

[57] ABSTRACT

A ballpoint pen of conventional size and shape has a movable ball point that is pressed upwardly in the direction of the housing of the pen when a mark is made. Means is provided for normally biasing the ballpoint outwardly of the housing. However, when the ballpoint is pressed against a writing surface, the refill cartridge having the ball at the lower end thereof is moved upwardly to close a normally open switch which connects a solar cell array in circuit with an electronic counter that counts each time the switch is closed. Controlled by the counter is a liquid crystal display that visually indicates the total number of counts. A second switch is actuated by gravity to reset or clear the counter in preparation for counting a succeeding group of marks.

5 Claims, 3 Drawing Figures

WRITING INSTRUMENT WITH SOLAR-POWERED ELECTRONIC COUNTING AND LIQUID CYRSTAL DISPLAY

BACKGROUND OF THE INVENTION

1. Field of the Invention

This invention relates generally to writing instruments capable of counting the number of marking strokes, and pertains more particularly to a ballpoint pen in which the ball of the pen is pressed upwardly in the direction of the housing to activate solar-powered counting and display circuitry, doing so each time a mark is made on a writing medium.

2. Description of the Prior Art

Writing instruments capable of counting the number of marks are not completely new. Examples of such devices are disclosed in U.S. Pat. No. 3,254,836, issued to Claire D. Corpian on June 7, 1966 for "TEACHER'S CORRECTION PEN" and U.S. Pat. No. 3,601,708, issued to Anthony S. Bongiovonni on Nov. 2, 1971 for "MARKER-COUNTER DEVICE." Insofar as we am aware, the alluded to patent devices are capable of performing their intended counting function. However, the pens are quite bulky, cumbersome, relatively costly and sufficiently complex so as to militate against any general use and adoption of such instruments. In order to actuate the mechanical counting mechanisms associated with the two patented devices, the ball point must move through a relatively great distance, for the length of stroke must be sufficient to advance the rotatable number wheels. In addition, the user must apply a sufficient amount of downward pressure so that the mechanical action required to advance the wheels will be realized; this detracts from the ease of making a mark that one normally expects and associates with a conventional ballpoint pen. Owing to the need to house a considerable number of parts, the overall size of the prior art writing implements further detracts from the adoption of such instruments. Hence, as viewed by the applicant, a need remains for a marking instrument that will accurately and conveniently count the number of marking strokes, doing so with an implement that closely resembles a conventional writing device, such as an ordinary ballpoint pen.

SUMMARY OF THE INVENTION

Accordingly, an object of the present invention is to provide a writing instrument capable of registering the number of marking strokes that will be of a size and shape corresponding to a conventional ballpoint pen.

Another object of the invention is to provide a writing or marking instrument capable of registering the marking strokes that the user makes that will be sufficiently lightweight so that when used over a prolonged period it will not prove tiring to the user.

Another object is to provide a writing implement of the foregoing character that will be long-lasting.

Also, the invention has for an object the provision of a writing instrument with counting capabilities incorporated therein that will be aesthetically attractive. In this regard, an aim of the invention is to not only have the instrument resemble an ordinary ballpoint pen but also devoid of external buttons that would detract from its appearance.

Yet another object of the invention is to provide a writing instrument with a mark-counting ability that can be used for general writing in that only a slight movement of the rolling ball at the tip of the instrument is needed in order to effect a count.

Another important object of the invention is to provide a writing instrument that will record the number of marks that the user makes with the instrument and which will be self-powered, more specifically, by reason of a solar cell array. Thus, when practicing the present invention, one need not be concerned about replacing batteries, even though the counting circuitry and the associated display are of an electronic nature.

The invention has for still a further object the facile resetting or clearing of the numerical display so that a succeeding group of counts can be undertaken. The invention will possess especial utility in the grading of examination papers by teachers in that once one paper has been graded the teacher need only reset the display in preparation for grading the next examination paper.

It is also planned that miniaturized integrated circuitry be employed that can be fabricated on a single silicon chip, thereby enabling the instrument to be mass-produced at a very low cost, thereby encouraging its widespread use by not only teachers, but others that must keep track of mark totals, such as when taking inventory and the like.

Still another object of the invention is to provide a ballpoint pen with a marking and registration capability that will make use of conventional reservoir or refill units as far as the ink supply is concerned.

Briefly, our invention envisages a ballpoint pen having a movable ball that is urged upwardly toward the pen's housing whenever a mark is made on a writing medium. At the upper end of the reservoir or refill, the ball being at the lower end, is a normally open switch that is closed each time a marking stroke is made so that a solar cell array is electrically connected in circuit with an electronic counter that provides a binary coded decimal (BCD) output indicative of the total count or tally that is forwarded to a liquid crystal display so that the user is immediately apprised of the total count or tally in decimal form resulting from the number of marking strokes that the user has made on a writing medium, such as an examination paper that is being scored or graded. By means of an invertible gravity switch, the counter can be quickly reset so that the display is completely cleared in preparation for counting a succeeding group of marks.

DESCRIPTION OF THE PREFERRED EMBODIMENT

Figure 1:
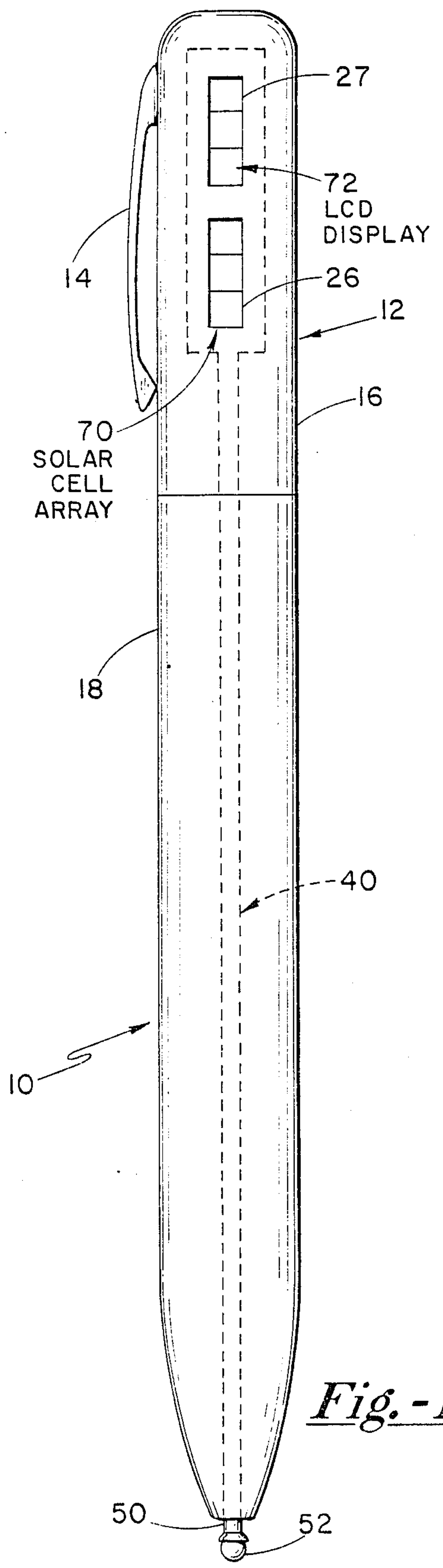
FIG. 1 an elevational view of a ballpoint pen exemplifying our invention.

Although our invention could be embodied in a mechanical pencil, the ballpoint pen that incorporates therein our invention is denoted generally by the reference numeral 10 comprising a tubular housing or body 12 having a clip 14 at its upper end. As is typical with ballpoint pens, the pen 10 includes an upper plastic component and a lower plastic component 18.

Figure 2:
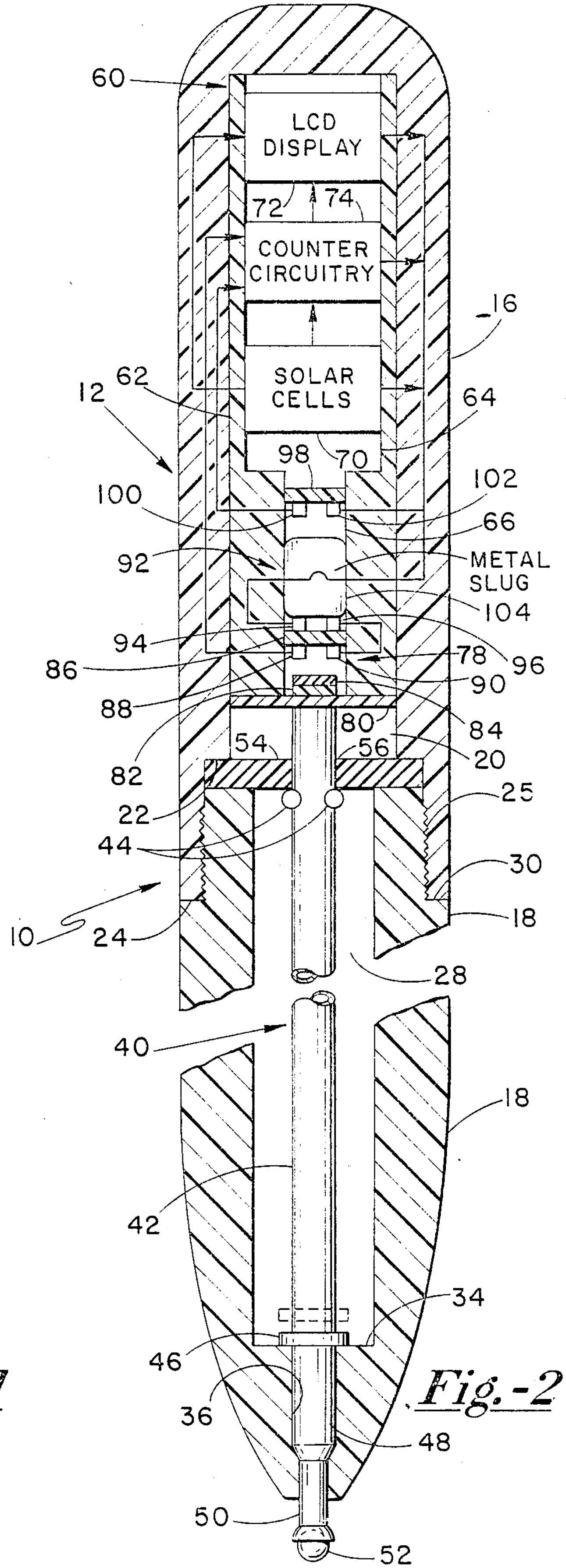
FIG. 2 is a vertical sectional view pictorially illustrating the internally housed components within the ballpoint pen.

Describing first the upper component 16, which has a closed top, it will be observed from FIG. 2 that it has a hollow interior or compartment 20 formed with an annular shoulder 22 inset from its bottom end 24. By means of internal threads 25, the two components 16 and 18 are detachably held together. For purposes later to be referred to, the upper component is formed with two rectangular windows 26 and 27.

As far as the lower component 18 is concerned, it has a hollow interior or compartment 28 provided with an outer annular shoulder 30 that abuts the bottom end 24 when the components 16 and 18 are threadably attached. The component 18 has an upper circular end 32 that does not abut or engage the shoulder 22 for a purpose hereinafter explained. The lower component 18 is formed so that an annular bottom 34 is provided at the lower end of the hollow interior or compartment 28. Further, there is a bore 36 of reduced cross section, the bore 36 leading to the lower end or writing tip of the pen 10.

Attention is now directed to a replaceable reservoir or refill cartridge indicated by the numeral 40 in which the writing ink is contained. More specifically, the reservoir or refill cartridge 40 includes an upper tube 42 of plastic, such as vinyl, having a pair of outwardly issuing ears or tabs 44, either molded or crimped thereon. Also, adjacent the lower end of the plastic tube 42 is an integral collar 46 that abuts or engages the annular bottom 34 of the hollow interior or compartment 28. The function of the collar 46 is to limit the downward movement of the plastic tube 42. The reservoir or refill cartridge 40 additionally includes a lower metal tube 48 that is fixedly connected to the plastic tube 42. The metal tube 48 has a somewhat constricted tip 50 that contains at its lower end a rolling ball 52 that applies ink from the reservoir 40 onto the surface to be marked.

In conventional ballpoint pens, the reservoir or refill cartridge 40 is normally urged upwardly by means of a coil spring and the upward bias is overcome by a push-button action to cause the ball to protrude from the pen's housing, the coil spring normally retracting the reservoir into the housing. However, in the present instance, just the reverse is planned. In this regard, a rubber washer 54 having a hole 56 therein encircles the upper portion of the plastic tube 42 of the reservoir or refill cartridge 40. The purpose of the rubber washer 54 is to urge or bias the entire cartridge 40 downwardly to cause the tip 50 and the ball 52 at the lower end thereof to protrude from the lower end of the component 18. This results in the previously mentioned collar 46 on the plastic tube 42 to engaging the annular bottom labelled 34. This simply prevents the reservoir or refill cartridge 40 from being completely ejected. More specifically, it will be recognized that the rubber, or other elastomeric material, circumjacent the hole 56 acts or bears against the ears or tabs 44 to gently urge the reservoir or refill cartridge 40 downwardly.

An assembly which will be generally identified as a cylindrical unit 60 comprises an elongated plastic casing 62 having a bore 64 and a counterbore 66 formed therein. The unit 60 is press-fitted into the compartment 20. The upper end of the component 16, being closed, enables the unit 60 to be merely pressed upwardly into engagement with its upper end.

The cylindrical unit 60 contains therein a solar cell array 70 which can be seen through the previously mentioned window 26. Also contained in the unit 60 is a liquid crystal display 72 that can be viewed through the other window 27. Additionally, there is an electronic decade counter 74 comprised of three cascaded BCD stages or orders that will be referred to in greater detail hereinafter. Likewise, there is a combination decoder/driver unit 76. However, individual or separate decoders and drivers may be employed, if desired; the combining of the functions conserves drafting space, though. The decoder portion of the decoder/-driver 76 converts the binary tally registered by the counter 74 to a corresponding 7-bit word for each stage and the 7-bit words are fed to the segment drivers of the driver portion of the decoder/driver 76, a procedure which will become more apparent when FIG. 3 is considered.

What will be termed a ballpoint switch 78 is also housed in the cylindrical unit 70. The ballpoint switch 78 is comprised of an elastomeric membrane or diaphragm 80, which can be rubber, having a dielectric disc 82 secured to its upper side, the disc 82 being of hard plastic. Carried on the upper surface of the disc 82 is an electrically conductive metal wafer 84. Although providing a dual function, it is to be noted that a second dielectric disc 86 of hard plastic is fixedly held in place within the bore 64, having a pair of electric contacts 88, 90 carried thereon. It can be pointed out at this stage that when the reservior or refill cartridge 40 is forced upwardly, as it is when marking pressure is applied to the pen 10, the diaphragm 80, being an elastomeric material, is flexed or bowed upwardly so that the metal wafer 84 engages the contacts 88, 90 to complete a circuit to the counter 74. Here again, this action will be better understood when FIG. 3 is discussed.

Whereas the switch 78 has been termed a ballpoint switch, a second switch will be called an invertible gravity switch, being generally denoted by the reference numeral 92. It has been mentioned that the disc 86 performs a dual purpose. Thus, it should be noted that the upper side or face of the disc 86 carries a pair of fixed contacts 94, 96. The invertible gravity switch 92 further comprises a dielectric disc 98 of hard plastic that is fixedly positioned in a vertically spaced relationship with the previously mentioned disc 86. Carried on the underside of the disc 98 is a pair of contacts 100, 102. The contacts 94, 96 are bridged or normally closed by means of a shiftable metal slug or pellet 104. It can be seen that the contacts 100, 102 of the invertible gravity switch 92 are connected in series with the contacts 88, 90 of the ballpoint switch 78. Consequently, when the pen 10 is held in a vertical or writing position, then the metal slug or pellet 104, owing to its weight, simply rests on the contacts 88, 90. However, when the pen 10 is inverted, then the slug or pellet 104 shifts so that it bridges or closes the normally open contacts 100, 102 on the underside of the upper disc 98 to supply a reset or clear signal to the counter 74 as can be appreciated from the phantom line position of the slug or pellet 104 in FIG. 3.

Figure 3:
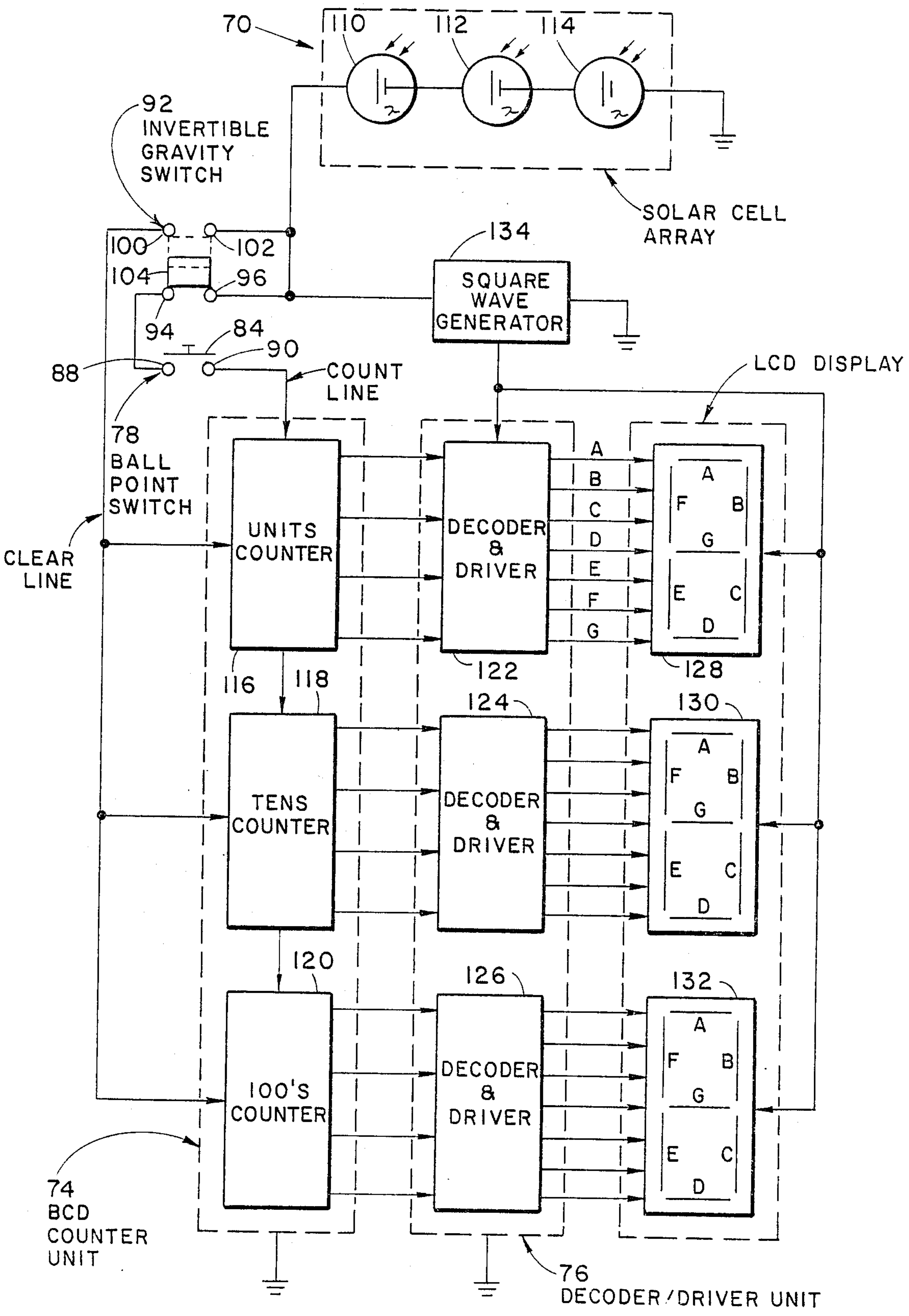
FIG. 3 is a combined schematic and block diagram of the electronic circuitry contained in the pen depicting our invention.

Referring now in detail to FIG. 3, it will be discerned that the solar cell array 70 comprises three photovoltaic cells 110, 112, and 114, these cells being connected in series. It will also be seen from FIG. 3 that the counter 74 comprises in this instance three decimal or BCD counting stages 116, 118 and 120. These counting stages 116, 118 and 120 are cascaded so as to count the pulses derived from the ballpoint switch 78, providing a displayed count from "0" to "999" inasmuch as the stage 116 constitutes a units counting stage, the stage 118 a tens counting stage and the stage 120 a hundreds counting stage. Since decimal or BCD counters of this type are well known, the exact construction or makeup of the stages 116, 118 and 120 need not be dealt with herein. It should be recognized, though, that each stage forwards a 4-bit word to the various decoder and driver sections contained in the decoder/driver unit 76.

It will be recognized that the decoder/driver unit 76 is composed of individual circuits 122, 124 and 126, each capable of converting the 4-bit word it receives from the counting stage 116, 118 or 120, as the case may be, to 7 bits needed to control the various segments of the LCD display 72. The LCD display 72 is comprised in this instance of three single-digit liquid-crystal indication devices which are identified by the reference numerals 128, 130 and 132. It will be understood that the LCD drive circuits within the driver portion of the decoder/driver unit 76 involve exclusive-OR (XOR) gates so as to interface the decoder section to the display 72 via the driver portion. Although the various gates contained in the decoder need not be shown, it will be recognized that by means of a square wave generator 134, a series of positive pulses are constantly applied to the backplane of each of the LCD devices 128, 130 and 132. Simultaneously, the square wave drive signal is applied to one input of each of the XOR gates contained within the decoder portion of the decoder/driver 76. The other gate inputs, to be consistent of course, are controlled by the 7 segment decoder values that are converted from the BCD signals forwarded from the various counting stages 116, 118 and 120 belonging to the counter 74. Although the display 74 is capable of displaying a number as large as 999, it is highly unlikely that an examination will have that many questions and answers. However, as far as inventory taking is concerned, it may be very well develop that all three devices 128, 130 and 132 will be activated.

Solely for the sake of discussion, it can be assumed that an examination has 100 questions and that the tally or total count of the counter 74 is "72", signifying that there are 72 correct answers. The device 128 will, therefore, display the numeral "7" and the device 130 will display the numeral "2". Under these circumstances, the device 132 will remain inactivated. More specifically, the segments A, B and C of the device 128 will be activated, whereas the segments A, B, G, E and D of the device 130 will be activated.

All that need be understood is that noninverted waveforms are applied to the backplanes of the devices 128, 130 (and also 132) but that inverted waveforms are applied to the segments A, B and C of the device 128 and segments A, B, G, E and D of the device 130. To all of the other segments of the devices 128 and 130, as well as all of the segments of the device 132, there will be no phase shift. Since the pulses are of the same polarity as those applied to the backplane of the three devices 128, 130 and 132, the segments not participating in the numerical readout will simply remain inactivated because of the same polarity being applied to the backplane and the segments that are not to be lighted.

Having presented the foregoing description, portions thereof having already dealt with the manner in which our writing implement 10 functions, it is believed that the benefits to be derived from a practicing of our invention will, for the most part, already have been recognized. Nonetheless, a brief resume of what occurs will perhaps be helpful in assuring that there is a complete appreciation of what can be achieved with the illustrated ballpoint pen 10. An arbitrary readout or count "72" has already been mentioned. This simply means that the pen 10 has been pressed downwardly against the writing medium (not shown) 72 times. It has been assumed that the examination consists of 100 questions and the "72" count would signify a score of 72 out of a possible 100 correct answers. Each time that the teacher, assuming that the pen 10 is being used by a teacher for grading purposes, is pressed downwardly to provide, say, a check mark (although a count could be made of the incorrect answers), the ball 52 is pressed or forced upwardly, causing the upper end of the reservoir or refill cartridge 40 to bear against the underside of the resilient diaphragm 80, urging the diaphragm 80 upwardly so that the metal wafer 84 electrically bridges the contacts 88, 90 on the underside of the fixedly disposed disc 86. What should be appreciated, though, is that the mounting of the disc 86 in a rigid manner prevents any appreciable upward movement of the diaphragm 80 and the disc 82 carried thereon. Only a few thousandths of an inch movement is needed to complete the circuit and, once completed, any further movement is restricted by reason of the engagement of the wafer 84 with the contacts 88, 90. The phantom position of the collar 46 on the plastic tube 42, even though exaggerated, will indicate, at least to some degree, the upward movement of the replaceable reservoir or refill cartridge 40 that effects the closing of the contacts 88, 90 to complete a circuit through the contacts 94, 96 so as to register the first count. Stated somewhat differently, there is an electrical path completed from the photovoltaic cell 110 of the serially connected cells 110, 112 and 114 of the solar cell array 70 to the input of the counting stage 116. This count will be immediately converted to a 4-bit word that is then processed by the decoder/driver 122 so as to activate the segments B and C of the device 128.

When the user of the pen 10 relaxes his or her downward pressure, the elastomeric washer 54, acting against the ears or tabs 44 on the plastic tube 42, breaks the circuit, since the washer 54, having been flexed upwardly, gently urges the entire cartridge 40 downwardly with the consequence that the elastomeric diaphragm 80 returns to its unflexed condition which is shown in FIG. 2. It is obvious that the pair of contacts 88, 90 are no longer bridged by the wafer 84 with the consequence that the circuit is interrupted and is readied for the next count.

Assuming that the count of "72" is reached and that the teacher wishes to clear the reading that has appeared on the display 72, the teacher need only invert the pen 10 so that the slug or pellet 104 shifts from the solid line position shown in FIGS. 2 and 3 to the dotted line position shown in FIG. 3. This energizes the reset or clear line leading to the several counting stages 116, 118 and 120 of the counter 74 which in turn deactivates the segments of the devices 128 and 130 so that nothing is displayed until the pen 10 is again pressed against the writing medium, in this case, the answer sheet.

It should be recognized that if one wishes to use the pen 10 in a conventional fashion, he or she is free to do so because the disc 86, being fixedly disposed, blocks any appreciable upward movement of the reservoir or refill cartridge 40 so that the user can simply write in the customary manner if he or she so wishes. The several thousandths movement, which is all that is needed to actuate the switch 78, makes it such that the user is virtually unaware that he or she is using a ballpoint pen differing in construction from a conventional one. Prior art pens of purely the mechanical linkage-type require an appreciable ball movement in order to produce a registration and would be quite objectionable if one were to use such a pen for general writing.

We claim:

1. A self-contained writing instrument capable of counting the number of marks made therewith comprising tubular housing means, a marking element telescopically received in said housing means, and having a marking end projecting from one end of said housing means, resilient means within said housing means acting on the end of said marking element opposite its said marking end to bias said marking element in an outward direction from said one end of said housing means, a switch in said housing means actuatable by movement of said opposite end of the marking element in an opposite direction from said outward direction, eletronic counting means contained entirely in said housing near the other end of thereof for counting the number of times said switch is actuated by said marking element, means contained in said tubular housing means and operated by said counting means for displaying the counted number of times said switch is actuated by said marking element, said housing means having a first window via which the counted number being displayed can be viewed, solar cell means contained in said tubular housing means connected directly to said electronic counting means for energizing said electronic counting means and connected directly to said display means for energizing said display menas, said tubular housing means having a second window via which light is transmitted onto said solar cell means, and gravity switch means for resetting said counting means in preparation for counting a subsequent number of marks.

2. A writing instrument in accordance with claim 1 in which said display means includes a plurality of liquid crystal devices in registry with said first window and said solar cell menas includes a plurality of serially connected photovoltaic cells in registry with said second window.

3. A self-contained writing instrument capable of counting the number of marks made therewith comprising tubular housing means, a refill cartridge having a ball at its lower end for making marks on a writing surface, means normally biasing said refill cartridge in a direction outwardly of said housing means, a normally open switch within said tubular housing actuated into a closed position by said refill cartridge when the ball thereof is pressed against a writing surface, a solar cell array in said housing means connected directly to said normally open switch, an electronic counter in said housing means energized directly by said solar cell array when said normally open switch is closed, a liquid crystal display also energized directly by said solar array controlled by said counter so that said display indicates the number of times said normally open switch is closed and hence the number of marks made by said ball when pressed against a writing surface, said tubular housing having a first window having a second window aligned with said tubular housing having a second window aligned with said liquid crystal display, and gravity switch means for resetting said counting means in preparation for counting a subsequent number of marks.

4. A writing instrument in accordance with claim 3 in which said housing means is comprised of two components, said refill cartridge being telescopically received in one of said components and said normally open switch, solar cell array, counter, display and said windows being disposed in the other of said components.

5. A writing instrument capable of counting the number of marks made therewith comprising tubular housing means, a marking element telescopically received in said housing means, resilient means biasing said marking element in an outward direction from one end of said housing menas, a switch in said housing means actuatable by movement of said marking element in an opposite direction, electronic counting means contained in said housing means for counting the number of times said switch is actuated by said marking element, means operated by said counting means for displaying the counted number of times said switch is actuated by said marking including element, a plurality of liquid crystal devices, a plurality of serially connected photovoltaic cells, solar cell menas for energizing said electronic counting means and said display means, and means for resetting said counting means including an invertible gravity switch.

* * * * *